United States Patent
Anand et al.

(10) Patent No.: US 10,715,139 B2
(45) Date of Patent: Jul. 14, 2020

(54) GATE-SOURCE VOLTAGE GENERATION FOR PULL-UP AND PULL-DOWN DEVICES IN I/O DESIGNS

(71) Applicant: Advanced Micro Devices, Inc., Santa Clara, CA (US)

(72) Inventors: Rajesh Mangalore Anand, Bangalore (IN); Jagadeesh Anathahalli Singrigowda, Bangalore (IN); Girish Anathahalli Singrigowda, Bangalore (IN); Prasant Kumar Vallur, Hyderabad (IN)

(73) Assignee: Advanced Micro Devices, Inc., Santa Clara, CA (US)

(*) Notice: Subject to any disclaimer, the term of this patent is extended or adjusted under 35 U.S.C. 154(b) by 0 days.

(21) Appl. No.: 16/120,836

(22) Filed: Sep. 4, 2018

(65) Prior Publication Data
US 2020/0076429 A1    Mar. 5, 2020

(51) Int. Cl.
*H03K 19/003*    (2006.01)
*H03K 17/687*    (2006.01)

(52) U.S. Cl.
CPC ... *H03K 17/6877* (2013.01); *H03K 19/00315* (2013.01)

(58) Field of Classification Search
CPC ............ H03K 19/00315; H03K 17/6877
USPC ........................... 327/108–112, 333
See application file for complete search history.

(56) References Cited

U.S. PATENT DOCUMENTS

| | | | |
|---|---|---|---|
| 4,527,081 A * | 7/1985 | Stewart | H03K 19/01707 326/17 |
| 6,040,729 A | 3/2000 | Sanchez et al. | |
| 8,421,501 B1 * | 4/2013 | Rien | H03K 19/018521 326/68 |
| 8,704,591 B1 | 4/2014 | Kumar et al. | |
| 8,791,724 B1 | 7/2014 | Huang et al. | |
| 9,197,199 B2 | 11/2015 | Huang et al. | |
| 9,798,345 B1 | 10/2017 | Jao et al. | |

(Continued)

OTHER PUBLICATIONS

"SN74LV1T08 Single Power Supply 2-Input Positive AND Gate CMOS Logic Level Shifter", Texas Instruments, Feb. 2014 (Year: 2014).*

(Continued)

*Primary Examiner* — Tomi Skibinski
(74) *Attorney, Agent, or Firm* — Polansky & Associates, P.L.L.C.; Paul J. Polansky; Nathan H. Calvert

(57) ABSTRACT

Driver and pre-driver circuitry operate in an integrated circuit with two supply voltages. In one form, a reference voltage generation circuit is operable to respond to varying voltage supply conditions in which a driver may be subject to over voltage effects by generating a reference voltage based the first supply voltage when the second supply voltage is not available, and based on the second supply voltage when the first supply voltage is not available. A first drive signal generation circuit drives a pull-up transistor gate based on a data signal, varying the gate voltage between the second supply voltage and the reference voltage. A second drive signal generation circuit drives a pull-down transistor gate with a signal varying between the second supply voltage minus the reference voltage, and zero volts. In one form, certain gate-source voltages in the driver are maintained to be equal.

26 Claims, 5 Drawing Sheets

(56) References Cited

U.S. PATENT DOCUMENTS

2013/0162044 A1* 6/2013 Mangattur ............ G06F 1/3287
307/64

OTHER PUBLICATIONS

Elnaz Ebrahimi, Rafael Trapani Possignolo and Jose Renau; "Level Shifter Design for Voltage Stacking"; White paper—Dept. of Computer Engineering; University of California—Santa Cruz; Santa Cruz, CA, 95064; United States; 4 pages.

* cited by examiner

| Equal gate-source voltage achievement across voltage variations when VDDIO1 is absent and VDDIO2 is present | | | |
|---|---|---|---|
| Gate-Source voltage | 1<br>VDDIO1=0V,<br>VDDIO2=2.97V<br>Vref=VDDIO2/2=<br>2.97V/2=1.485V | 2<br>VDDIO1=0V,<br>VDDIO2=3.3V<br>Vref=VDDIO2/2=<br>3.3V/2=1.65V | 3<br>VDDIO1=0V,<br>VDDIO2=3.63V<br>Vref=VDDIO2/2=<br>3.63V/2=1.815V |
| p-gate<br>$V_{sg}=(V_s - V_g)$ | (2.97V-1.485V)=1.485V | (3.3V-1.65V)=1.65V | (3.63V-1.815V)=1.815V |
| n-gate<br>$V_{gs}=(V_g - V_s)$ | (1.485V-0V)=1.485V | (1.65V-0V)=1.65V | (1.815V-0V)=1.815V |
| ΔV Difference<br>b/w P-gate and N-gate Gate-Source Voltage | 1.485V-1.485V=0V | 1.65V-1.65V=0V | 1.815V-1.815V=0V |

FIG. 6

GATE-SOURCE VOLTAGE GENERATION FOR PULL-UP AND PULL-DOWN DEVICES IN I/O DESIGNS

BACKGROUND

Input/output (I/O) circuits are typically arranged in cells at the periphery of integrated circuit chips, and interface between a chip's core and the external world. I/O cells usually include a driver to transmit digital signals and a receiver to receive digital signals. In integrated circuits that use multiple supply voltages, the I/O cells often must work with at least two supplies to support compatibility with the legacy standards. If the maximum operating voltage of the I/O cell's transistors are compliant to one voltage domain, they are expected to work in higher voltage domains to support industry interface standards as well as meet their own timing, slew control and other requirements of I/O specification.

To operate the I/O cell's transistors in safe tolerable regions without causing any reliability issues like Gate-Oxide Breakdown, Hot Carrier Electrons (HCE), Negative Bias Temperature Instability (NBTI) and Electro-migration, there are a few conventional techniques. Such techniques include stacking of transistors, reference voltage generation, and process/voltage/temperature (PVT) independent design topologies. These solutions typically employ voltage dependent biasing of the transistors. In multi-voltage operation, however, a common problem with such voltage dependent biasing is that the transistors experience asymmetric behavior with voltage variation. This causes multiple performance issues including transistor drive strength mismatch, slew rate offset, duty cycle distortion (DCD) and unoptimized silicon area, to name a few.

BRIEF DESCRIPTION OF THE DRAWINGS

FIG. 6 shows in table form an analysis of the gate-source voltage achieved with the embodiment of FIG. 5 for conditions where a first supply voltage VDDIO1 is absent;

Figure 1:
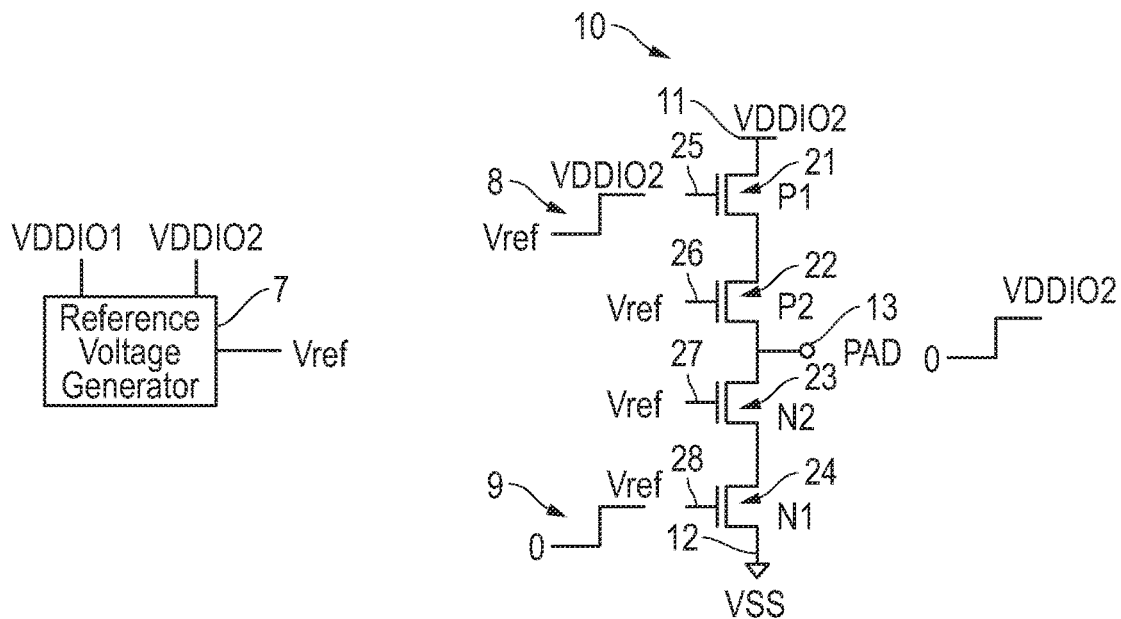
FIG. 1 illustrates in partial block diagram and partial schematic form a stacked driver and associated voltage signals known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a data transmission circuit includes a driver having a positive terminal, a negative terminal, and an output terminal. One or more pull-up transistors are coupled to the positive terminal and the output terminal, and one or more pull-down transistors are coupled between the output terminal and the negative terminal. A reference voltage generation circuit is provided for selecting, based at least upon activation of a first supply voltage, a reference voltage based on the first supply voltage or based on a predetermined fraction of a second supply voltage. A pre-driver circuit includes a first drive signal generation circuit for creating a first drive signal based on a data signal and feeding the first drive signal to a gate of one of the pull-up transistors. The pre-driver circuit includes including circuitry operable to shift a voltage level of the data signal to the second supply voltage as a digital high of the first drive signal and the reference voltage as a digital low of the first drive signal. A second drive signal generation circuit is provided for creating a second drive signal based on the data signal and feeding the second drive signal to a gate of one of the pull-down transistors. The second drive signal generation circuit includes circuitry operable to create the second drive signal as a level-shifted version of the data signal with zero volts as a digital low value and the second supply voltage minus the reference voltage as a digital high value.

In another form, a method is provided for operating a driver in an integrated circuit with multiple supply voltages. The method includes, based on a presence of a first supply voltage and an absence of a second supply voltage, creating a reference voltage based on the first supply voltage. Based on a presence of the second supply voltage and an absence of the first supply voltage, the method the reference voltage derived as a predetermined fraction of the second supply voltage. Based on a presence of both supply voltages, the method creates the reference voltage from the first supply voltage. The method includes receiving a data signal, and driving a gate of a pull-up transistor with a first drive signal based on the data signal shifted with the second supply voltage as a digital high and the reference voltage as a digital low. The method also drives a gate of a pull-down transistor with a second drive signal based on the data signal shifted with the second supply voltage minus the reference voltage as a digital high and zero volts as a digital low.

In yet another form, a circuit includes a reference voltage generation circuit, a first drive signal generation circuit, and a second drive signal generation circuit. The reference voltage generation circuit is operable to receive a first supply voltage and a second supply voltage having a supply voltage level higher than that of a device breakdown voltage on a host integrated circuit. The reference voltage generation circuit is operable to respond to varying voltage supply conditions in which a driver may be subject to over voltage effects based on the second supply voltage by generating a reference voltage based on the first supply voltage when the second supply voltage is not available, and based on the second supply voltage when the first supply voltage is not available. The first drive signal generation circuit is operable to generate a first gate voltage signal for a first pull-up transistor of the driver based on a data signal, the first gate voltage signal comprising digital high values at the second supply voltage, and digital low values at the reference voltage. The second drive signal generation circuit is operable to generate a second gate voltage signal for a first pull-down transistor of the driver based on the data signal, the second gate voltage signal comprising digital high values at the second supply voltage minus the reference voltage, and digital low values at zero volts.

In still another form, a method is provided for operating a stacked driver in semiconductor circuit having a first supply voltage and a second supply voltage. The method includes, in response to a first condition in which the driver may be subject to over voltage conditions based on the second supply voltage having a supply voltage level higher than that of a device breakdown voltage on the semiconductor circuit, generating a reference voltage based on a predetermined fraction of the second supply voltage. The method includes receiving a data signal and in response the first condition, generating a first gate voltage signal for a first pull-up transistor of the driver based on the data signal, the first gate voltage signal comprising digital high values at the high supply voltage, and digital low values at the reference voltage. Further in response the first condition, the method includes generating a second gate voltage signal for a first pull-down transistor of the driver based on the data signal, the second gate voltage signal comprising digital high values at the high supply voltage minus the reference voltage, and digital low values at zero volts.

FIG. 1 shows in partial schematic form a data transmission circuit including a conventional I/O driver design known as a stacked driver. In this example the host integrated circuit operates with a first supply voltage VDDIO1, while the driver 10 operates with a second supply voltage VDDIO2, connected at its positive terminal 11. Output terminal 13 connects driver 10 through suitable conductive structures to an external output pad or to an internal bus or other pathway upon which data is to be transmitted. Driver 10 includes two pull-up transistors 21 and 22, and two pull-down transistors 23 and 24. To drive a digital high on the output terminal 13, pull-up transistors 21 and 22 are turned on and pull the voltage on output terminal 13 up to the supply voltage, while the pull-down transistors are off. To drive a digital low value on output terminal 13, the pull-down transistors are turned on to pull output terminal 13 down to the system ground or $V_{SS}$ voltage on negative terminal 12, with the pull-up transistors turned off. Voltages are applied to the gates 25-28 of the driver transistors to achieve these states.

Such gate voltages are chosen to avoid possible damage from overloading the transistors with a gate-source voltage higher than their maximum operating voltage. For example, if pull-up transistors 21-22 and pull-down transistors 23-24 have a maximum operating voltage in a VDDIO1 domain of, for example, 1.8V, these devices should be tolerant to work in a VDDIO2 domain of, for example, 3.3V, when functioning in multi-voltage applications. Therefore, to ensure power sequence independent designs and protect the devices from Electrical Over Stress (EOS), a reference voltage (referred to Vref hereafter) is generated by reference voltage generator 7, with Vref derived either from VDDIO1 or VDDIO2 to protect the devices from EOS based on the following three conditions:

(1) When VDDIO1 is available and VDDIO2 is not available (the supply voltage is not active, or is at 0V), reference voltage Vref is derived from VDDIO1, and typically set equal to VDDIO1. If VDDIO2 is not available, the stacked device structure is not expected to work (because VDDIO2 is the supply for the driver) and no stress is induced on the devices because they are VDDIO1 voltage tolerant.

(2) When VDDIO1 is unavailable and VDDIO2 is available, then reference voltage Vref is derived from a predetermined fraction of VDDIO2, preferably VDDIO2/2, (for example 3.3V/2=1.65V). Vref is used as the gate input voltage for pull-up transistor 22 and pull-down transistor 23, which are held always on during driver 10 operation, to protect the transistors from EOS. A first drive signal 8 is applied to gate 25 of pull-up transistor 21, and varies between digital low values of Vref and digital high values of VDDIO2. A second drive signal 9 is applied to gate 28 of pull-down transistor 24, and varies between digital low values of 0V or $V_{SS}$, and digital high values of Vref. When, second drive signal 9 is 0V, pull-down transistor 24 is cut-off. Concurrently, if first drive signal 8 is equal to Vref, pull-up transistor 21 is ON and pulls output terminal 13 to the VDDIO2 supply level without causing the stress on devices. Similarly, when first drive signal 8 is at the VDDIO2 voltage level, pull-up transistor 21 is cut-off, and if second drive signal 9 is concurrently equal to Vref, the output pad is pulled down to $V_{SS}$ safely.

(3) When both supply voltages VDDIO1 and VDDIO2 are available, then reference voltage Vref is derived from VDDIO1. When second drive signal 9 is 0V, pull-down transistor 24 is cut-off, and if first drive signal 8 is equal to Vref, then pull-up transistor 21 is ON and pulls output terminal 13 to the VDDIO2 supply voltage level without causing EOS. Similarly, when first drive signal 8 is at VDDIO2, pull-up transistor 21 is cut-off, and if second drive signal 9 is at Vref, output terminal 13 is pulled to $V_{SS}$ safely.

While this Vref generation process helps to protect the driver transistors from EOS, it can lead to other performance problems. In the typical CMOS process conditions, the gate-source voltages of pull-up and pull-down transistors 21-24 are expected to be equal to achieve similar transistor behaviors in terms of drain current ($I_d$), drive strength, DC characteristics, and AC characteristics. However, during PVT variations, drivers using the conventional stacking of devices will often have a difference in the gate-source voltage because VDDIO1 and VDDIO2 supply voltages can both vary independently (usually ±10%) along with process and temperature fluctuations. In the "corner conditions," where one supply is at a high fluctuation while the other is at a low fluctuation, the driver design of FIG. 1 exhibits highly uneven gate-source terminal voltages on pull-up transistor 21 and pull-down transistor 24.

Figure 2:
FIG. 2 shows in table and diagram form an analysis of the unequal gate-source voltage achieved in a stacked driver operating at multiple voltage domains for corner cases when voltage supplies are stable.

The table of FIG. 2 summarizes the unequal gate-source voltage achieved in the previous architecture for corner cases of VDDIO1 and VDDIO2 supplies when they are stable. The columns headings contain the supply voltage values used in the analysis or simulation to produce the data in each column. The table rows show, in order, the source-gate voltages of pull-up transistor 21 ("p-gate"), the gate-source voltages of transistor 24 ("n-gate"), the difference between the p-gate and n-gate voltages (ΔV), and the resulting duty cycle distortion (from simulation) as a percentage of the transistor time ON ($T_{on}$) and time OFF ($T_{off}$) during digital transmission with driver 10. Also shown below the table are diagrams of the duty cycle distortions 201 resulting from unequal gate-source voltage across the voltage variations. Some important values may be observed in the table. In column 3, data is shown for a −10% variation of VDDIO2 (VDDIO2=2.97V) simultaneous with a +10% of VDDIO1 (VDDIO1=Vref=1.98V). When driving a high signal on output terminal 13, gate 25 is at Vref=1.98V, and gate 28 is at 0V, the gate-source voltage of pull-up transistor 21 is 1.98V−2.97V=|0.99|. To drive a low signal on output terminal 13, gate 28 is at Vref=1.98V, and gate 25 is at 2.97V, and the gate-source voltage of pull-down transistor 24 is 1.98V −0V=1.98V. Such unequal biasing of p-gate at |0.99V| and n-gate at 1.98V provides a ΔV as shown of 0.99V. A similarly deleterious situation is shown in column 2, reflecting a +10% variation of VDDIO2 (VDDIO2=3.63V) simultaneous with a −10% variation of VDDIO1 (VDDIO1=Vref=1.62V). This results in a ΔV of 0.39V. In both cases, the gate-source terminal voltage of p-gate and n-gate are highly unequal, causing mismatches in the behavior of transistors 21 and 24. In column 3, where VDDIO1=1.98V and VDDIO2=2.97V, the gate source voltages of p-gate and n-gate vary by almost 100%.

Such a mismatch of gate-source voltage in pull-up and pull-down devices creates several issues. Mismatch in gate-source voltage can require uneven sizing of devices and result in increased area in each I/O driver. If the I/O driver circuitry is instantiated many times in an integrated circuit such as a System-On-Chip (SoC), the unoptimized area overhead increases proportionally. Also, the higher the gate-source voltage, the higher the device strength becomes. Similarly, for lower gate-source voltages, the device strength is reduced. This means that the gate-source voltage has a direct impact on the turn-on and turn-off time of the signal/clock which causes duty cycle distortion as seen by the diagrams of duty cycle distortions 201 below the respective columns.

Figure 3:
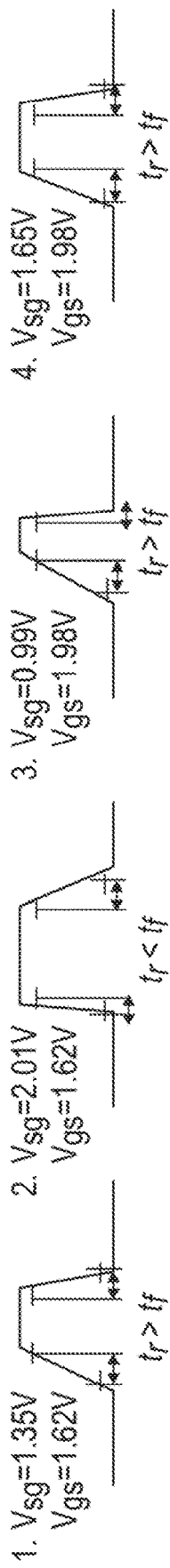
FIG. 3 shows in diagram form a graphical representation of slew rate change for the four different combinations of gate-source voltages set forth in FIG. 2.

Another issue is the fact that any mismatch in the gate-source voltage of pull-up and pull-down devices will influence the rising and falling edge rate transition and causes violation of slew rate in cross corner variations. FIG. 3 shows four diagram representations of slew rate changes for the driver 10 output voltage on output terminal 13 in operation. The diagrams are numbered 1-4 matching the associated column data in FIG. 2. The rise times ($t_r$) and fall times ($t_f$) for the output voltage are shown along with the corresponding gate-source and source-gate voltage values identified by "p-gate" and "n-gate" in FIG. 2. The affects of the gate-source voltage mismatches are especially severed in the diagrams labelled "2" and "3," showing a highly asymmetric rise and fall waveform for driver 10's output. I/O driver output waveforms are often analyzed by overlaying them to form an "eye" shape. It is desired that the center of the eye shape be clear, and bounded by rise and fall times that are consistent across operation. By contrast, the depicted waveforms cross the center area unequally and require tighter specifications for receiving the transmitted signal from driver 10. Hence, there is a need to overcome these performance issues and provide equal gate-source voltage for pull-up and pull-down devices and accomplish similar, symmetrical behavioral characteristics.

Figure 4:
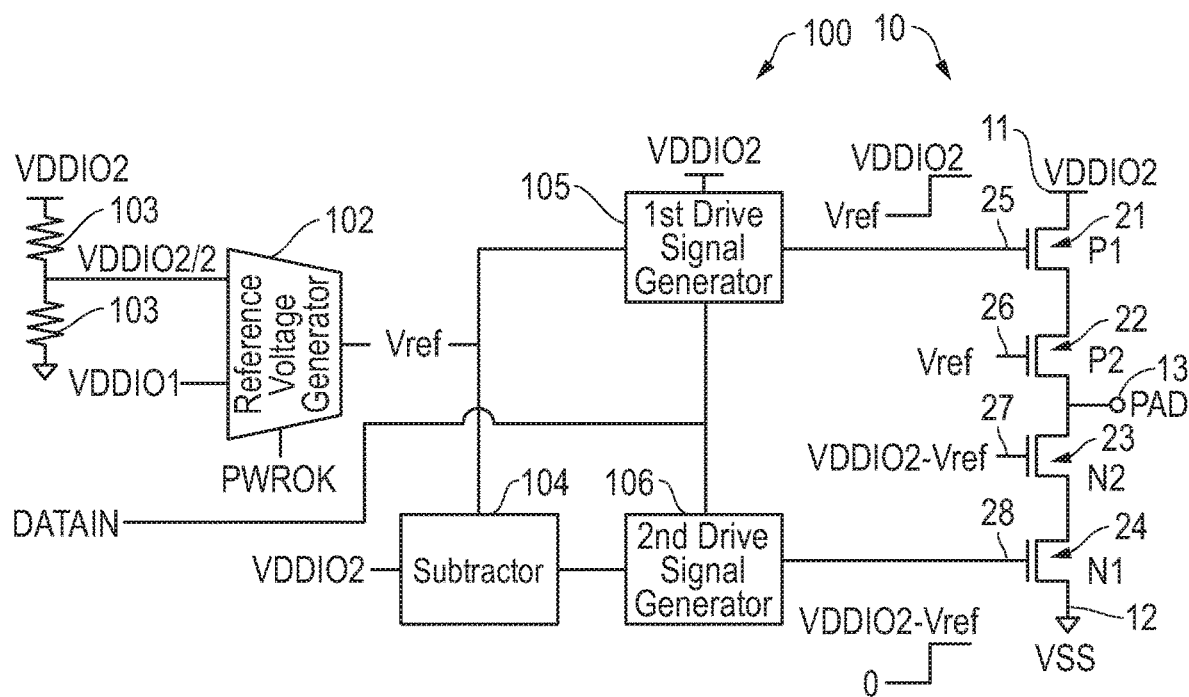
FIG. 4 illustrates in partial block diagram and partial schematic a data transmission circuit according to some embodiments.

FIG. 4 illustrates in partial block diagram and partial schematic form a data transmission circuit including driver 10 and pre-driver circuitry 100 according to some embodiments. Driver 10 is constructed similarly to that of FIG. 1, except that transistor gates 25-28 are driven with different pre-driver circuitry 100, and receive different voltage signals to achieve equal gate-source voltages in a variety of voltage supply conditions. Generally, reference voltage generation circuit 102 provides reference voltage Vref, which is employed by first and second drive signal generators 105 and 106 in producing voltage signals to transistor gates on driver 10. Reference voltage generation circuit 102 responds to certain conditions in which driver 10 may be subject to EOS due to second supply voltage VDDIO2, and produces or selects a different value for reference voltage Vref depending on the conditions. Reference voltage generation circuit 102 receives as inputs first supply voltage VDDIO1, and another voltage produced by the voltage divider series arrangement of resistors 103. Resistors 103 create a voltage divider, providing a predetermined fraction of second supply voltage VDDIO2. In this embodiment, resistors 103 have equal values in order to produce a value of VDDIO2/2 as shown. Reference voltage generation circuit 102 includes circuitry for selecting, based at least upon activation of the first supply voltage, the value of reference voltage Vref to be based on the first supply voltage or based on VDDIO2/2, and applying the selected voltage to the output labeled "Vref." In this embodiment, reference voltage generation circuit 102 receives a digital signal PWROK which has a high value indicating that the first supply voltage VDDIO1 is active at a designated supply voltage and has completed its initialization, or a low value indicating first supply voltage VDDIO1 is not initialized or is otherwise unavailable. Reference voltage generator is typically constructed with at least one digitally controlled switch to select one of the input voltages to be provided as the reference voltage Vref, but may be constructed with any suitable circuitry to provide reference voltage Vref as described. In some embodiments, reference voltage generation circuit 102 may include other digital or analog circuitry for detecting the status or value of one or both of the supply voltages.

Reference voltage generation circuit 102 may be configured to respond to conditions that may cause EOS to the driver 10 transistors according to the three conditions described above with regard to FIG. 1. In other embodiments, other of conditions may be used in addition to or instead of the conditions described. For example, availability of more than two power supplies may be taken into account. In embodiments where a particular power supply voltage may have variable voltage supply levels, such variations may be part of one or more of the conditions.

Reference voltage Vref is employed by pre-driver circuitry 100 including first drive signal generator 105 and second drive signal generator 106 to generate drive signals and voltages for gates 25-28 of driver 10. Gate 26 of pull-up transistor 22 receives reference voltage Vref, holding pull-up transistor 22 ON during normal operation of driver 10. First drive signal generator 105 is supplied with second supply voltage VDDIO2 and receives as inputs reference voltage Vref and a data signal DATAIN to be transmitted by driver 10. An output of first drive signal generator 105 is connected to gate 25 of first pull-up transistor 21 of driver 10. On this output, first drive signal generator 105 generates a first gate voltage signal for first pull-up transistor 21 based on the data signal DATAIN, the first gate voltage signal including digital high values at the high supply voltage VDDIO2, and digital low values at the reference voltage, as depicted by digital waveform on the diagram next to gate 25.

Referring to the pre-driver circuitry for pull-down transistors 23 and 24, a voltage subtractor 104 receives as inputs reference voltage Vref and second supply voltage VDDIO2. Voltage subtractor 104 generates a voltage of VDDIO2-Vref, supplied at an output terminal connected to second drive signal generator 106. Gate 27 of pull-down transistor 23 receives the voltage level produced by voltage subtractor 104, VDDIO2-Vref, preferably with a direct connection from the output of voltage subtractor 104. This gate voltage holds pull-down transistor 23 ON during normal operation of driver 10. Voltage subtractor 104 may be implemented as an analog voltage subtractor or other suitable circuitry for generating a difference of two voltages.

In addition to the voltage VDDIO1-Vref, second drive signal generator 106 receives as an input data signal DATAIN. An output of second drive signal generator 106 is connected to gate 28 of first pull-down transistor 24. On this output, second drive signal generator 106 generates a second gate voltage signal based on the data signal DATAIN, the second gate voltage signal comprising digital high values at the second supply voltage minus the reference voltage, and digital low values at 0V or the system low voltage level $V_{SS}$.

In operation, the first and second drive signal generation circuits 105 and 106 work to maintain the gate-source voltage of pull-up transistor 21 during its activation equal to the gate-source voltage of pull-down transistor 24 during its activation. As further discussed below with respect to FIG. 7 and FIG. 8, such equal gate-source voltages are maintained across PVT variations in which the first and second supply voltages vary independently. This provides the advantages of EOS protection and stable, symmetrical, and predictable operation across PVT variations, as will be further discussed below.

Figure 5:
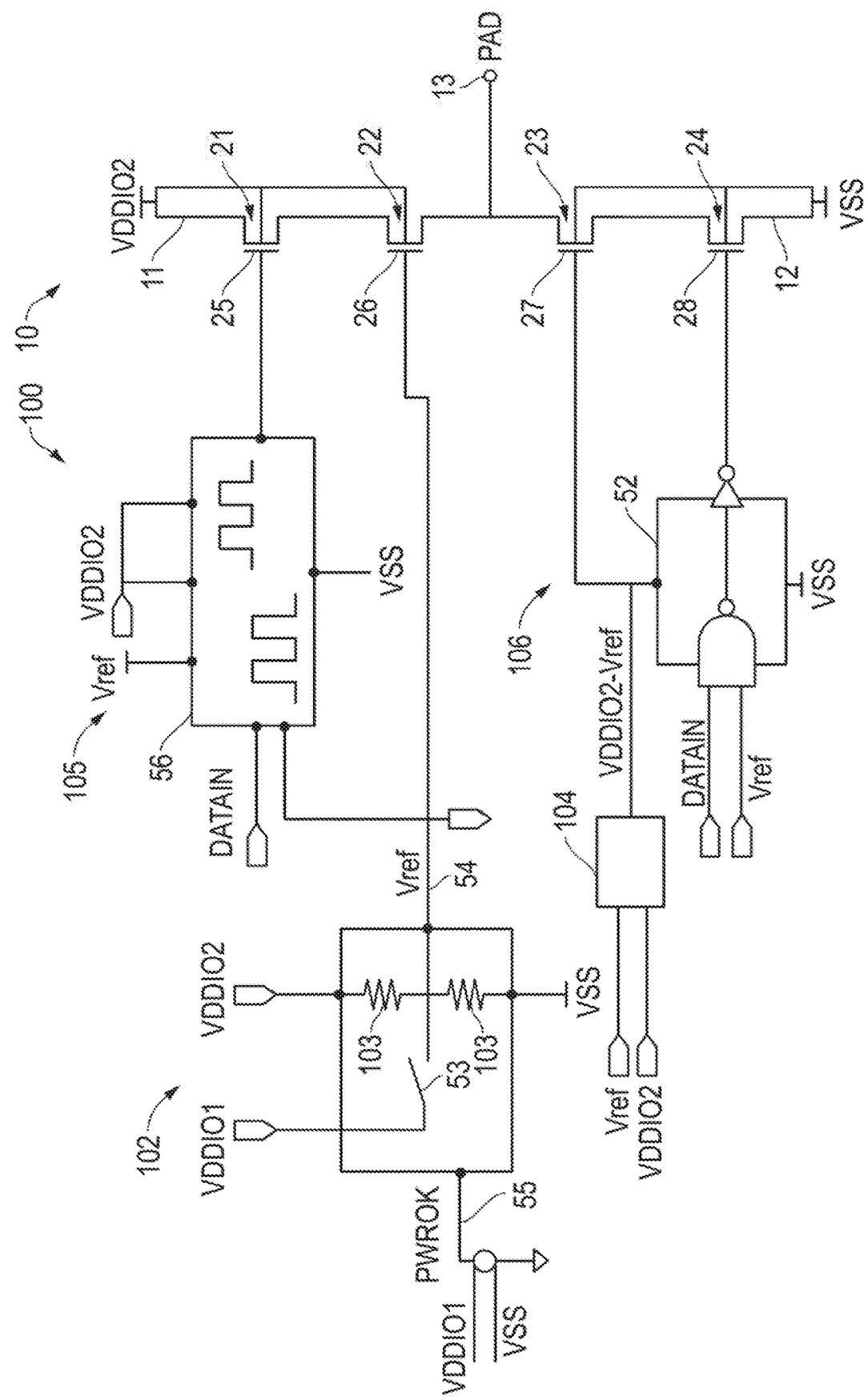
FIG. 5 illustrates in schematic form a data transmission circuit according to some embodiments.

FIG. 5 illustrates in schematic form pre-driver circuitry 100 and driver 10, showing details of an example implementation of pre-driver circuitry 100 according to some embodiments. Driver 10 is shown having similar transistors to those in FIG. 4, including pull-up transistors 21 and 22, and pull-down transistors 23 and 24 which pull output terminal 13 to the desired voltage. The diffusion regions, or bodies, of pull-up transistors 21 and 22 are shown connected to second voltage supply VDDIO2, and the diffusion regions of pull-down transistors 23 and 24 are shown connected to $V_{SS}$, in order bias the diffusion regions.

Reference voltage generation circuit 102 includes circuitry for generating, based at least upon activation of the first supply voltage, the value of reference voltage Vref output to be based on first supply voltage VDDIO1 or based on a second supply voltage VDDIO2. Reference voltage generation circuit 102 receives as inputs first supply voltage VDDIO1, and second supply voltage VDDIO2. Reference voltage generation circuit 102 also receives a signal PWROK on a digital input 55. Signal PWROK has a high value indicating that the first supply voltage VDDIO1 is available at a designated supply voltage and has completed its initialization, or a low value indicating first supply voltage VDDIO1 is not initialized or is otherwise unavailable. A switch 53 is controlled by signal PWROK, and has a first terminal connected to the VDDIO1 input, and a second terminal connected to output 54. Switch 53 operates to apply first supply voltage VDDIO1 to Vref output 54 when ON and second supply voltage VDDIO2 is not available, and disconnect VDDIO1 from output 54 when OFF and second supply voltage VDDIO2 is available. Also connected to the node of output 54 is a voltage divider circuit created by resistors 103 connected in series between the VDDIO2 input and $V_{SS}$. Resistors 103 provide a predetermined fraction of second supply voltage VDDIO2 to output 54 connected to the voltage divider. In this embodiment, resistors 103 have equal values in order to produce a value of VDDIO2/2 as shown. Resistors 103 preferably have a value much higher than the output impedance of the VDDIO1 supply, such that the voltage on output 54 is established by VDDIO1 when switch 53 is ON. When switch 53 is OFF, the voltage divider of resistors 103 provides the voltage of output 54. As can be understood, this example circuit operates to generate reference voltage Vref according to the three conditions discussed above with regard to FIG. 1, because when VDDIO1 is available, it is applied to output 54 by switch 53, and dominates the voltage of the voltage divider whether or not VDDIO2 is present.

Reference voltage Vref is employed by first drive signal generator 105 and second drive signal generator 106. Referring to first drive signal generator 105, the depicted implementation includes a level shifter 56, employed in a modified configuration from the typical level-shifter application of shifting between different voltage domains. Generally, level shifter 56 receives signal DATAIN and produces a shifted version Voltage Vref is applied as an output to gate 25. Level shifter 56 receives Vref on two inputs, as an enable signal and as on a first VDD reference input for controlling the lower level of the shifted signal. Level shifter 56 also receives VDDIO2 as a supply voltage and as a second VDD reference input for controlling the higher level of the shifted signal. In operation, level shifter 56 produces a first gate voltage signal based on the data signal DATAIN, which is applied to gate 25. The first gate voltage signal including digital high values at the second supply voltage VDDIO2, and digital low values at the reference voltage Vref.

Referring to the pre-driver circuitry for pull-down transistors 23 and 24, a voltage subtractor 104 is provided like that in the embodiment of FIG. 4. Voltage subtractor 104 receives as inputs reference voltage Vref and second supply voltage VDDIO2, and generates a voltage of VDDIO2-Vref, supplied at an output terminal connected to an input to second drive signal generator 106. Gate 27 of pull-down transistor 23 receives the voltage level produced by voltage subtractor 104, VDDIO2-Vref, through a direct connection from the output of voltage subtractor 104. This gate voltage holds pull-down transistor 23 ON during normal operation of driver 10.

Second drive signal generator 106 also receives as an input data signal DATAIN. An output of second drive signal generator 106 is connected to gate 28 of first pull-down transistor 24. On this output, second drive signal generator 106 generates a second gate voltage signal based on the data signal DATAIN, the second gate voltage signal comprising digital high values at the second supply voltage minus the reference voltage, and digital low values at 0V or the system low voltage level $V_{SS}$. The signal generation is performed by an AND gate 52 employed in a modified configuration. AND gate 52 operates with a voltage supply input of with the second supply voltage minus the reference voltage, provided from the output of voltage subtractor 104. The performing an AND operation on the data signal DATAIN and the reference voltage Vref. This operation causes the output to vary between $V_{SS}$ and the level of VDDIO2-Vref. While AND gate 52 is shown here, other suitable pre-driver logic circuitry may be used to generate the second gate voltage signal, using a voltage supply of VDDIO2-Vref. Likewise, the first gate voltage signal may be generated by other pre-driver logic circuitry whose supply is at VDDIO2. It should be noted that the logic level of the first gate drive signal applied to gate 25 is same as the second gate drive signal applied to gate 28 at the same time. That is, when data signal DATAIN is high, the first gate voltage signal is will be shifted to logic high-VDDIO2 and it turns OFF pull-up transistor 21, while the second gate voltage signal is also at its logic high-(VDDIO2-Vref) and it turns ON pull-down transistor 24. Similarly, when data signal DATAIN is low, the first gate voltage signal is at its logic low-Vref and it turns ON pull-up transistor 21, while the second gate voltage signal is also at its logic low-VSS and it turns OFF pull-down transistor.

In operation, the first and second drive signal generation circuits 105 and 106 work similarly to those of FIG. 4 to maintain the gate-source voltage of pull-up transistor 21 during its activation equal to the gate-source voltage of pull-down transistor 24 during its activation. Such equal gate-source voltages are maintained across PVT variations in which the first and second supply voltages vary independently.

In construction of this embodiment, the pull-up transistors are PMOS transistors and the pull-down transistors are NMOS transistors. However, this is not limiting, and other transistor technologies may be used. In the present embodiment, the PMOS transistors and NMOS transistors having a maximum operating voltage higher than the first supply voltage and lower than the second supply voltage. Typically this maximum operating voltage is about 110% of VDDIO1, or 110% the general voltage domain in which the majority of transistors in the host integrated circuit will operate, if that domain employs a different supply from VDDIO1. This maximum operating voltage represents a general rating for the technology employed to construct the driver transistors, and individual transistors will, of course, have variations. It should be noted that while a driver 10 is shown with a reference voltage generation circuit 102, each individual driver is not required to have its own associated reference voltage generation circuit. A single Vref signal can be fed to multiple drivers 10. Similarly, the voltage subtractor circuit 104 is not required to be duplicated for each driver instance. If multiple drivers are operating simultaneously, the output of voltage subtractor 104 may also be connected to multiple drivers.

FIG. 6 shows in table form an analysis of the gate-source voltage achieved with the embodiment of FIG. 5 for conditions where VDDIO1 is absent and VDDIO2 varies by 10% higher and lower than its nominal value of 3.3V. The table data is structured similarly to that in FIG. 2, using the same variable names, with the supply voltages and Vref voltages employed to produce each set of results listed across the column headers. As shown, the ΔV voltage difference between the p-gate and n-gate gate-source voltages is 0V in each case.

Figure 7:
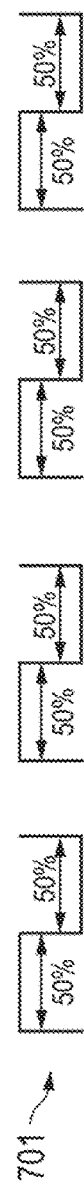
FIG. 7 shows in table and diagram form an analysis of the equal gate-source voltage achieved with the embodiment of FIG. 5 for corner cases when voltage supplies VDDIO1 and VDDIO2 are stable.

FIG. 7 shows in table and diagram form an analysis of the equal gate-source voltage achieved with the embodiment of FIG. 5 for corner cases when voltage supplies are stable. The columns headings contain the supply voltage values used in the analysis or simulation to produce the data in each column. The table rows show, like FIG. 2, the source-gate voltages of pull-up transistor 21 ("p-gate"), the gate-source voltages of transistor 24 ("n-gate"), the difference between the p-gate and n-gate voltages (ΔV), and the resulting duty cycle distortion (from simulation) as a percentage of the transistor time ON ($T_{on}$) and time OFF ($T_{off}$) during digital transmission with driver 10 in the embodiment of FIG. 5. Also shown below the table are diagrams of the duty cycle 701 resulting from gate-source voltages provided. As can be seen, the differences in gate-source voltages, ΔV, that were present in the data transmission circuit of FIG. 1 are reduced to zero in this embodiment.

Figure 8:
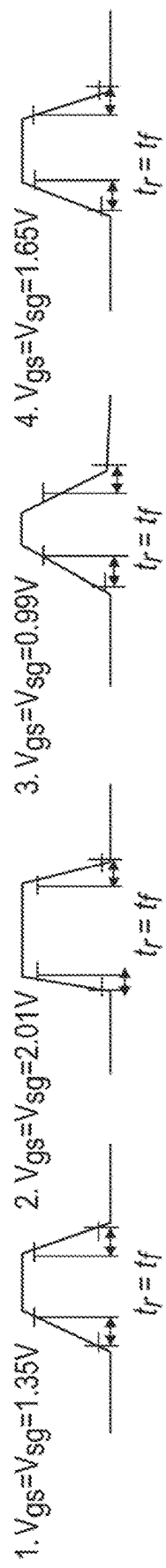
FIG. 8 shows in diagram form a graphical representation of slew rate change for the embodiment of FIG. 5 for the four different combinations of gate-source voltages.

FIG. 8 shows in diagram form four depictions of slew rate changes for the embodiment of FIG. 5, corresponding to the four different combinations of gate-source voltages in the table of FIG. 7. The diagrams are labeled similarly to those of FIG. 3. As shown, the slew rates are now symmetrical going up and down, with rise times and fall times being equal. Pre-drive circuitry 100 with its use of different signaling voltage levels for the gate voltage signals applied to gates 25 and 28 successfully mitigates the unequal gate source voltages. This provides many advantages including mitigating the associated issues of transistor drive strength mismatch, slew rate offset, duty cycle distortion. Further, with the resulting symmetrical performance across varying conditions, the specifications for receiving data transmitted from driver 10 can be relaxed. Also, the data transmission speed can be increased somewhat for driver 10 without requiring higher quality transistors in construction. Such an increase has many advantages for reducing cost in drivers and receives with very high transmission speeds, such as speeds in the several-GHz range.

The data transmission systems of FIGS. 4 and 5, or portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware comprising integrated circuits. The netlist is then placed and routed to produce a data set describing geometric shapes to be applied to masks. The masks are then used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, more than two voltage supply levels may be present in a system. Reference voltage generation circuit 102 may therefore be altered to respond to a larger set of conditions and to produce a larger variation of values for Vref. Further, the pre-driver and circuitry herein may be used with drivers that have an adjustable supply voltage, where other pre-driver circuitry may not provide sufficient adaptability. The data transmission circuitry herein may be employed for data transmission external to an IC, within a multi-chip module, or internal data transmission in some situations.

Accordingly, it is intended by the appended claims to cover all modifications of the disclosed embodiments that fall within the scope of the disclosed embodiments.

What is claimed is:

1. A data transmission circuit comprising:
   a driver having a positive terminal, a negative terminal, an output terminal, a first transistor and a second transistor coupled in series between the positive terminal and the output terminal, and a third and fourth transistor coupled in series between the output terminal and the negative terminal;
   a reference voltage generation circuit for selecting, based at least upon activation of a first supply voltage, a reference voltage based on the first supply voltage or based on a predetermined fraction of a second supply voltage; and
   a pre-driver circuit comprising:
       a first drive signal generation circuit for creating a first drive signal based on a data signal and feeding the first drive signal to a gate of the first transistor, including circuitry operable to shift a voltage level of the data signal to the second supply voltage as a digital high of the first drive signal and the reference voltage as a digital low of the first drive signal, wherein a gate of the second transistor is configured to receive the reference voltage; and a second drive signal generation circuit for creating a second drive signal based on the data signal and feeding the second drive signal to a gate of the fourth transistor, including circuitry operable to create the second drive signal as a level-shifted version of the data signal with zero volts as a digital low value and the second supply voltage minus the reference voltage as a digital high value, wherein a gate of the third transistor is configured to receive the second supply voltage minus the reference voltage.

2. The data transmission circuit of claim 1, wherein the first and second drive signal generation circuits are operable to maintain a gate-source voltage of the pull-up transistor during its activation equal to a gate-source voltage of the pull-down transistor during its activation.

3. The data transmission circuit of claim 2, wherein the first and second drive signal generation circuits are further operable to maintain the equal gate-source voltages across process, voltage, or temperature (PVT) variations in which the first and second supply voltages vary independently.

4. The data transmission circuit of claim 1, wherein the second drive signal generation circuit further comprises a voltage subtractor circuit receiving the second supply voltage and the reference voltage as inputs, and having an output of the second supply voltage minus the reference voltage.

5. The data transmission circuit of claim 4, wherein the second drive signal generation circuit further comprises an AND gate having inputs configured to receive the data signal and the reference voltage, the AND gate driven with a supply voltage of the second supply voltage minus the reference voltage.

6. The data transmission circuit of claim 1, in which the one or more pull-up transistors are PMOS transistors and the one or more pull-down transistors are NMOS transistors, the PMOS transistors and NMOS transistors having a maximum operating voltage higher than the first supply voltage and lower than the second supply voltage.

7. A method of operating a driver in an integrated circuit with multiple supply voltages, the method comprising:
based on a presence of a first supply voltage and an absence of a second supply voltage, creating a reference voltage based on the first supply voltage;
based on a presence of the second supply voltage and an absence of the first supply voltage, creating the reference voltage as a predetermined fraction of the second supply voltage;
based on a presence of both the first supply voltage and the second supply voltage, creating the reference voltage from the first supply voltage;
receiving a data signal;
driving a gate of a pull-up transistor of the driver with a first drive signal based on the data signal shifted with the second supply voltage as a digital high and the reference voltage as a digital low;
applying the reference voltage to a gate of a second pull-up transistor of the driver;
driving a gate of a pull-down transistor of the driver with a second drive signal based on the data signal shifted with the second supply voltage minus the reference voltage as a digital high and zero volts as a digital low; and applying the second supply voltage minus the reference voltage to a gate of a second pull-down transistor of the driver.

8. The method of claim 7, in which driving the gate of the pull-up transistor and driving the gate of the pull down transistor further comprises maintaining a gate-source voltage of the pull-up transistor during its activation equal to a gate-source voltage of the pull-down transistor during its activation.

9. The method of claim 8, in which driving the gate of the pull-up transistor and driving the gate of the pull down transistor further comprises maintaining the equal gate-source voltages across process, voltage, or temperature (PVT) variations in which the first and second supply voltages vary independently.

10. The method of claim 7, further comprising providing the second supply voltage minus the reference voltage with a voltage subtractor.

11. The method of claim 7, in which driving the gate of the pull-down transistor comprises performing an AND operation with the data signal and the reference voltage with an AND gate supplied with the second supply voltage minus the reference voltage.

12. The method of claim 7, in which creating the reference voltage based on the first supply voltage includes making the reference voltage equal to the first supply voltage, and in which creating the reference voltage as the predetermined fraction of the second supply voltage includes making the reference voltage equal to the second supply voltage divided by two.

13. A circuit comprising:
a reference voltage generation circuit operable to receive a first supply voltage and a second supply voltage having a supply voltage level higher than that of a device breakdown voltage on a host integrated circuit, and operable to respond to varying voltage supply conditions in which a driver may be subject to over voltage effects based on the second supply voltage by generating a reference voltage based the first supply voltage when the second supply voltage is not available, and based on the second supply voltage when the first supply voltage is not available;
a first drive signal generation circuit operable to generate a first gate voltage signal for a first pull-up transistor of the driver based on a data signal, the first gate voltage signal comprising digital high values at the second supply voltage, and digital low values at the reference voltage, the first drive signal generation circuitry further comprising circuitry coupling the reference voltage to a gate of a second pull-up transistor of the driver; and
a second drive signal generation circuit operable to generate a second gate voltage signal for a first pull-down transistor of the driver based on the data signal, the second gate voltage signal comprising digital high values at the second supply voltage minus the reference voltage, and digital low values at zero volts, the second drive signal generating circuit further comprising circuitry connecting the second supply voltage minus the reference voltage to a gate of a second pull-down transistor of the driver.

14. The circuit of claim 13, which the first and second drive signal generation circuits are operable to maintain a gate-source voltage of the pull-up transistor during its activation equal to a gate-source voltage of the pull-down transistor during its activation.

15. The circuit of claim 14, wherein the first and second drive signal generation circuits are further operable to maintain the equal gate-source voltages across process, voltage or temperature (PVT) variations in which the first and second supply voltages vary independently.

16. The circuit of claim 13, in which the varying voltage supply conditions comprise a first condition including availability of the first supply voltage and unavailability of the second supply voltage, the reference voltage generation circuit further operable to respond to the first condition by making the reference voltage to be equal to the first supply voltage.

17. The circuit of claim 16, in which the varying voltage supply conditions comprise a second condition in which the first supply voltage is unavailable and the second supply voltage is available, the reference voltage generation circuit further operable to respond to the second condition by generating the reference voltage based on a predetermined fraction of the second supply voltage.

18. The circuit of claim 17, in which the varying voltage supply conditions comprise a third condition including availability of the first supply voltage and the second supply voltage, the reference voltage generation circuit further operable to respond to the third condition by making the reference voltage equal to the first supply voltage.

19. The circuit of claim 13, wherein the second drive signal generating circuit further comprises a voltage subtractor circuit having the second supply voltage and the reference voltage coupled as inputs and an output of the second supply voltage minus the reference voltage.

20. The circuit of claim 13, wherein the second drive signal generating circuit further comprises an AND gate having inputs configured to receive the data signal and the reference voltage, and an output providing second gate voltage signal, the AND gate supplied with the second supply voltage minus the reference voltage.

21. A method of operating a driver in semiconductor circuit having a first supply voltage and a second supply voltage, the method comprising:
in response to a first condition in which the driver may be subject to over voltage conditions based on the second supply voltage having a supply voltage level higher than that of a device breakdown voltage on the semiconductor circuit, generating a reference voltage based on a predetermined fraction of the second supply voltage;
receiving a data signal;
in response the first condition, generating a first gate voltage signal for a first pull-up transistor of the driver based on the data signal, the first gate voltage signal comprising digital high values at the high supply voltage, and digital low values at the reference voltage;
applying the reference voltage to a gate of a second pull-up transistor of the driver;
in response the first condition, generating a second gate voltage signal for a first pull-down transistor of the driver based on the data signal, the second gate voltage signal comprising digital high values at the high supply voltage minus the reference voltage, and digital low values at zero volts; and
applying the high supply voltage minus the reference voltage to a gate of a second pull-down transistor of the driver.

22. The method of claim 21, further comprising maintaining a gate-source voltage of the first pull-up transistor during its activation equal to a gate-source voltage of the first pull-down transistor during its activation.

23. The method of claim 22, further comprising maintaining the equal gate-source voltages across process, voltage, or temperature (PVT) variations in which the first and second supply voltages vary independently.

24. The method of claim 21, further comprising:
in response to a second condition in which the driver may be subject to over voltage conditions based on the second supply voltage, the second condition including enablement of the first supply voltage the second condition, generating the reference voltage at a new value based on the first supply voltage;
after generating the reference voltage based on the first supply voltage, generating the first gate voltage signal based on the data signal, the first gate voltage signal comprising digital high values at the second supply voltage, and digital low values at the reference voltage; and
after generating the reference voltage based on the first supply voltage, generating the second gate voltage signal, the second gate voltage signal comprising digital high values at the second supply voltage minus the reference voltage, and digital low values at zero volts.

25. The method of claim 24, further comprising, after generating the reference voltage based on the first supply voltage, applying the reference voltage to a gate of a second pull-up transistor of the driver.

26. The method of claim 24, further comprising, after generating the reference voltage based on the first supply voltage, applying the second supply voltage minus the reference voltage to a gate of a second pull-down transistor of the driver.

* * * * *